(12) United States Patent
Nair et al.

(10) Patent No.: US 11,978,948 B2
(45) Date of Patent: *May 7, 2024

(54) DIE WITH EMBEDDED COMMUNICATION CAVITY

(71) Applicant: Intel Corporation, Santa Clara, CA (US)

(72) Inventors: Vijay K. Nair, Mesa, AZ (US); Digvijay Ashokkumar Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 17/458,911

(22) Filed: Aug. 27, 2021

(65) Prior Publication Data

US 2021/0391638 A1  Dec. 16, 2021

Related U.S. Application Data

(63) Continuation of application No. 16/335,535, filed as application No. PCT/US2016/053681 on Sep. 26, 2016, now Pat. No. 11,128,029.

(51) Int. Cl.
*H01Q 1/22* (2006.01)
*H01L 21/48* (2006.01)
(Continued)

(52) U.S. Cl.
CPC ....... *H01Q 1/2283* (2013.01); *H01L 21/4857* (2013.01); *H01L 23/13* (2013.01);
(Continued)

(58) Field of Classification Search
CPC .......... H01Q 1/2283; H01Q 1/38; H01Q 1/52; H01L 2223/6677; H01L 23/66
See application file for complete search history.

(56) References Cited

U.S. PATENT DOCUMENTS 9,620,464 B2 * 4/2017 Baks .................... H01Q 9/0457
11,128,029 B2   9/2021 Nair et al.
(Continued)

FOREIGN PATENT DOCUMENTS

CN   101118890 A   2/2008
CN   103369816 A   10/2013
(Continued)

OTHER PUBLICATIONS

"Chinese Application Serial No. 201680088753.X, Office Action dated Nov. 2, 2022".
(Continued)

*Primary Examiner* — Hasan Islam
(74) *Attorney, Agent, or Firm* — Essential Patents Group, LLP

(57) ABSTRACT

Generally discussed herein are systems, devices, and methods that include a communication cavity. According to an example a device can include substrate with a first cavity formed therein, first and second antennas exposed in and enclosed by the cavity, and an interconnect structure formed in the substrate, the interconnect structure including alternating conductive material layers and inter-layer dielectric layers.

19 Claims, 13 Drawing Sheets

(51) Int. Cl.
  *H01L 23/00* (2006.01)
  *H01L 23/13* (2006.01)
  *H01L 23/538* (2006.01)
  *H01L 23/66* (2006.01)
  *H01L 25/065* (2023.01)
  *H01Q 13/00* (2006.01)

(52) U.S. Cl.
  CPC ...... *H01L 23/5381* (2013.01); *H01L 23/5383* (2013.01); *H01L 23/5386* (2013.01); *H01L 23/66* (2013.01); *H01L 24/16* (2013.01); *H01L 25/0655* (2013.01); *H01Q 13/00* (2013.01); *H01L 2223/6616* (2013.01); *H01L 2223/6677* (2013.01); *H01L 2224/16227* (2013.01); *H01L 2224/16235* (2013.01); *H01L 2224/16237* (2013.01)

(56) References Cited

U.S. PATENT DOCUMENTS

| | | | |
|---|---|---|---|
| 2006/0001572 | A1 | 1/2006 | Gaucher et al. |
| 2008/0186247 | A1 | 8/2008 | Cotte et al. |
| 2009/0207080 | A1* | 8/2009 | Floyd ............ H01Q 1/2283 343/700 MS |
| 2009/0244874 | A1 | 10/2009 | Mahajan et al. |
| 2009/0315797 | A1 | 12/2009 | Rofougaran et al. |
| 2011/0187602 | A1 | 8/2011 | Nair et al. |
| 2012/0119969 | A1 | 5/2012 | Macdonald et al. |
| 2012/0280860 | A1 | 11/2012 | Kamgaing et al. |
| 2014/0062607 | A1 | 3/2014 | Nair et al. |
| 2014/0091474 | A1* | 4/2014 | Starkston ............ H01L 25/50 361/767 |
| 2015/0021403 | A1 | 1/2015 | Finn et al. |
| 2015/0084210 | A1 | 3/2015 | Chiu et al. |
| 2015/0171015 | A1 | 6/2015 | Mahajan et al. |
| 2015/0364830 | A1 | 12/2015 | Tong et al. |
| 2016/0141234 | A1 | 5/2016 | We et al. |
| 2016/0293557 | A1* | 10/2016 | Topak ............ H01P 3/14 |
| 2018/0240762 | A1 | 8/2018 | Kamgaing et al. |
| 2019/0206791 | A1 | 7/2019 | Pietambaram et al. |
| 2020/0021007 | A1 | 1/2020 | Nair et al. |

FOREIGN PATENT DOCUMENTS

| | | |
|---|---|---|
| CN | 104205679 A | 12/2014 |
| CN | 104952838 A | 9/2015 |
| CN | 109661725 | 4/2019 |
| JP | 2011258654 A | 12/2011 |
| WO | 2018057025 | 3/2018 |

OTHER PUBLICATIONS

"International Application Serial No. PCT US2016 053681, Written Opinion mailed Jun. 7, 2017", 4 pgs.

"International Application Serial No. PCT US2016 053681, International Search Report mailed Jun. 7, 2017", 3 pgs.

"International Application Serial No. PCT US2016 053681, International Preliminary Report on Patentability mailed Apr. 4, 2019", 6 pgs.

"U.S. Appl. No. 16/335,535, Restriction Requirement mailed Nov. 17, 2020", 7 pgs.

"U.S. Appl. No. 16/335,535, Response filed Jan. 14, 2021 to Restriction Requirement mailed Nov. 17, 2020", 7 pgs.

"U.S. Appl. No. 16/335,535, Non Final Office Action mailed Mar. 9, 2021", 8 pgs.

"U.S. Appl. No. 16/335,535, Response filed May 12, 2021 to Non Final Office Action mailed Mar. 9, 2021", 7 pgs.

"U.S. Appl. No. 16/335,535, Examiner Interview Summary mailed May 14, 2021", 2 pgs.

"U.S. Appl. No. 16/335,535, Notice of Allowance mailed May 20, 2021", 9 pgs.

U.S. Appl. No. 16/335,535 U.S. Pat. No. 11,128,029, filed Mar. 21, 2019, Die With Embedded Communication Cavity.

* cited by examiner

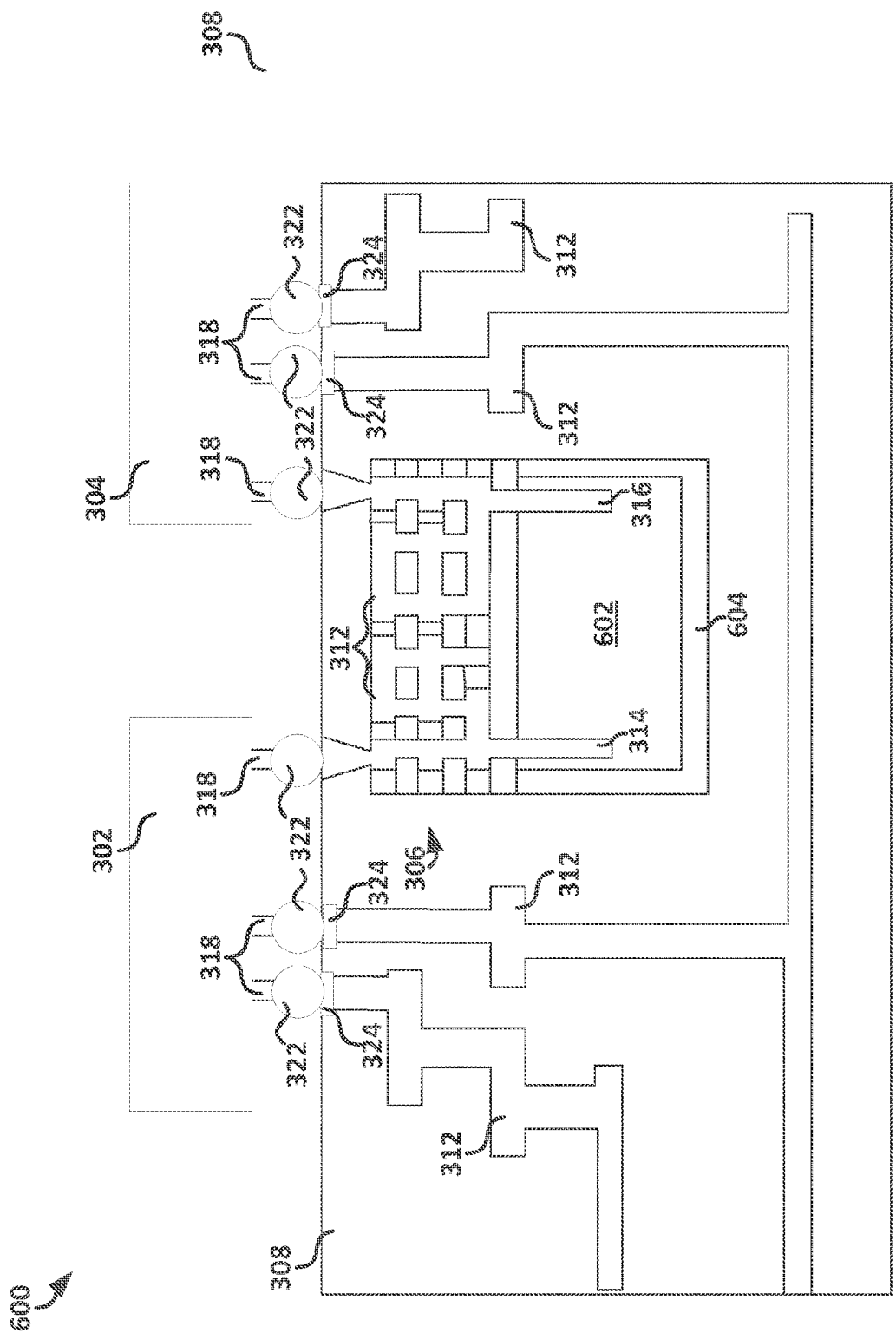

DIE WITH EMBEDDED COMMUNICATION CAVITY

This application is a continuation of U.S. patent application Ser. No. 16/335,535, filed Mar. 21, 2019, which is a U.S. National Stage Filing under 35 U.S.C. 371 from International Application No. PCT/US2016/053681, filed on Sep. 26, 2016, each of which application is incorporated herein by reference in its entirety.

TECHNICAL FIELD

Embodiments generally relate to packages that can include a communication cavity, such as can be configured for high speed communications. Some embodiments can include a device with a high density interconnect structure and/or a communication cavity.

TECHNICAL BACKGROUND

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 6 illustrates, by way of example, a cross-section view diagram of an embodiment of a device similar to the device and the structure, with the device including a communication cavity below the high density interconnect structure.

DESCRIPTION OF EMBODIMENTS

Figure 1:
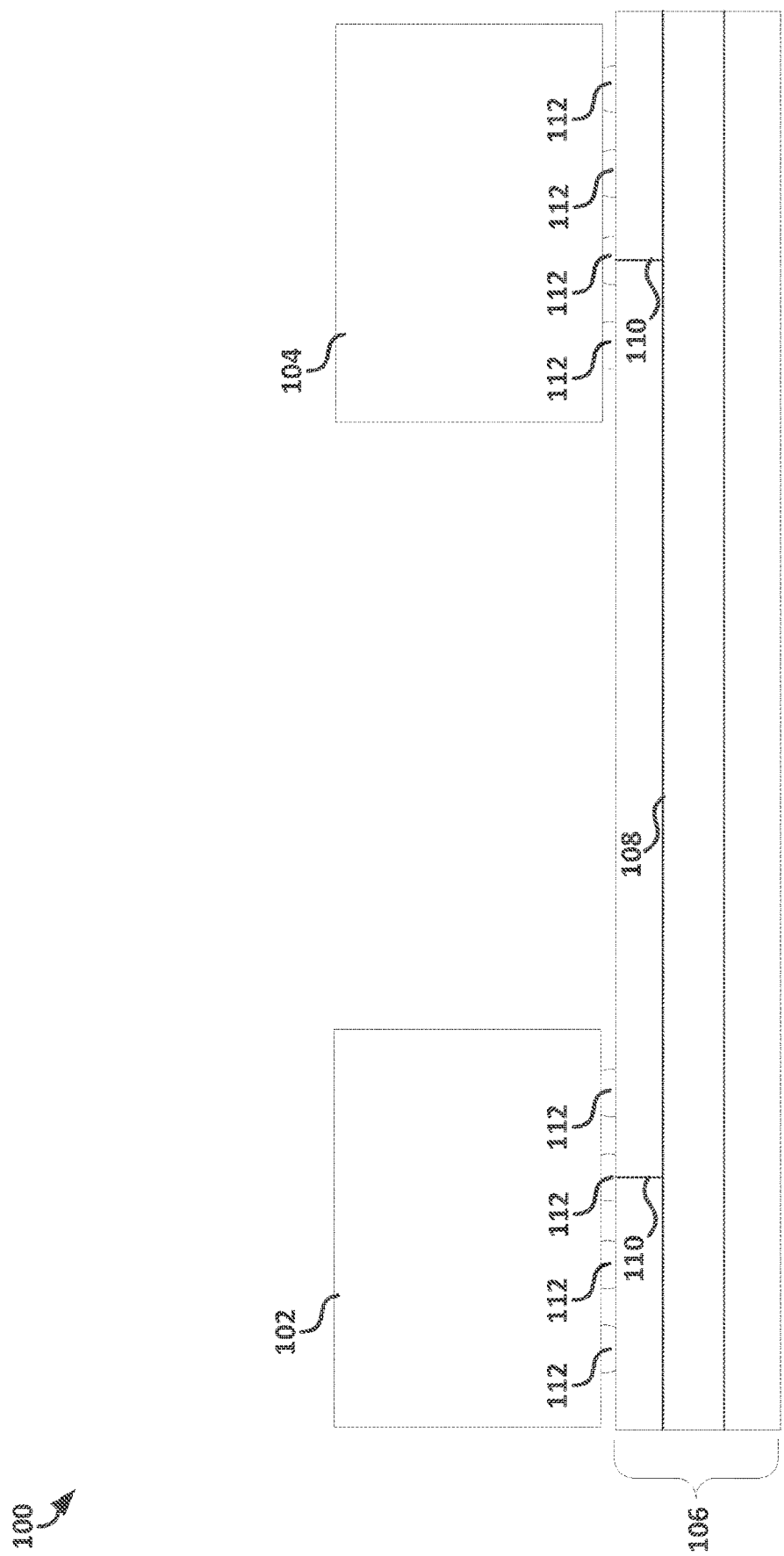
FIG. 1 illustrates, by way of example, a cross-section diagram of an embodiment of a system that allows signals to be communicated between dies through a PCB.

Embodiments generally relate to packages that can include a communication cavity, such as can be configured for high speed communications. Some embodiments can include a device with a high density interconnect structure and/or a communication cavity.

The following description includes terms, such as upper, lower, first, second, etc. that are used for descriptive purposes only and are not to be construed as limiting. The examples of an apparatus, device, or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Today's server and client computer applications can benefit from or require very high data rate between processors. These processors can include chips that have one or more high density interconnect structures. In order to achieve very high density interconnections between dies one or more embedded multi-die interconnect bridges (EMIB), sometimes referred to as silicon bridges, can be used to connect multiple dies. The silicon bridge can include an interconnect density possible using a chip-level manufacturing process, such as a dual damascene process. An interconnect can include one or more of a pad, via, trace, plane, or other conductive component. However, as the frequency of operation increases, interconnect loss increases, such as can be due to metal surface roughness. Such interconnects are also subject to cross-talk interference and/or spurious noise pick up.

These interconnect issues deteriorate the quality of the signals. One or more devices discussed herein can include a communication cavity for radio frequency communication between chips, such as can include a millimeter wave transceiver circuit, such as in addition to a silicon bridge in the same die, such as a system on chip (SOC) die. The signal interference between RF and digital signals can become a hindrance if adequate precautions are not taken.

One solution to help avoid one or more of the cross-talk and signal degradation issues of interconnects can include using wireless interconnects to provide data through wireless chip-to-chip communication and other cavity approaches, such as at a very high data rate. Since antennas are placed in a noisy environment (e.g., in open air), the antenna can be subjected to noise pick up, multipath variations, and/or interference from objects nearby. A waveguide structure can be built using a cavity in the substrate, such as can include a completely enclosed cavity. One or more embodiments can help enable high frequency wireless transmission and high digital transmission between two devices using a communication cavity in a substrate, such as a silicon substrate.

Some embodiments discussed herein regard combining a high density interconnect structure and a communication cavity that can help achieve high density routing as well as high speed communication. The embodiments can help enable high frequency wireless transmission and high speed digital interconnects using one device. One or more embodiments can include a communication cavity (e.g., a waveguide structure) within the substrate, such as can be in a high density interconnect structure or in another substrate of the device.

In one or more embodiments, the communication cavity can be at least partially enclosed or completely enclosed in a conductive material and/or shielded, such that an RF signal transmission can be contained within the shielded communication cavity and isolated from the high speed digital signals that can be transmitted via copper interconnects and other noise around the communication cavity. In one or more embodiments, the enclosure (sometimes referred to as the shield) can be grounded.

The waveguides can be implemented using a cavity (e.g., an etched, or otherwise formed, groove) in a substrate. The waveguides can be excited using structures of chips electrically connected thereto. Waveguides, such as can be created without etching the substrate, can be implemented but generally require the use of relatively high-cost and low-loss substrates. Air-filled, or low loss dielectric waveguides, can be used to help create much lower-loss communication devices as compared to antennas and can be implemented using standard printed circuit board (PCB) or chip manufacturing technology.

One or more embodiments discussed herein can provide one or more advantages over conductive interconnects for high frequency wireless transmission. A cavity can be created (and shielded), such as to create a controlled environment and/or provide shielding from external noises and RF interference.

FIG. 1 illustrates, by way of example, a cross-section diagram of an embodiment of a system 100 that allows signals to be communicated between chips 102 and 104 through a PCB 106. The chip 102 is connected to the chip 104 through one or more pads on the PCB, vias 110 in the PCB 106, and traces 108 in the PCB 106. The routing density of traces in the PCB 106 is generally much less dense than substrate routing in the chip 102 and 104. The routing of interconnects in/on the PCB can be greater than 100 times less dense than routing of interconnects in the chips 102 and 104.

Figure 2:
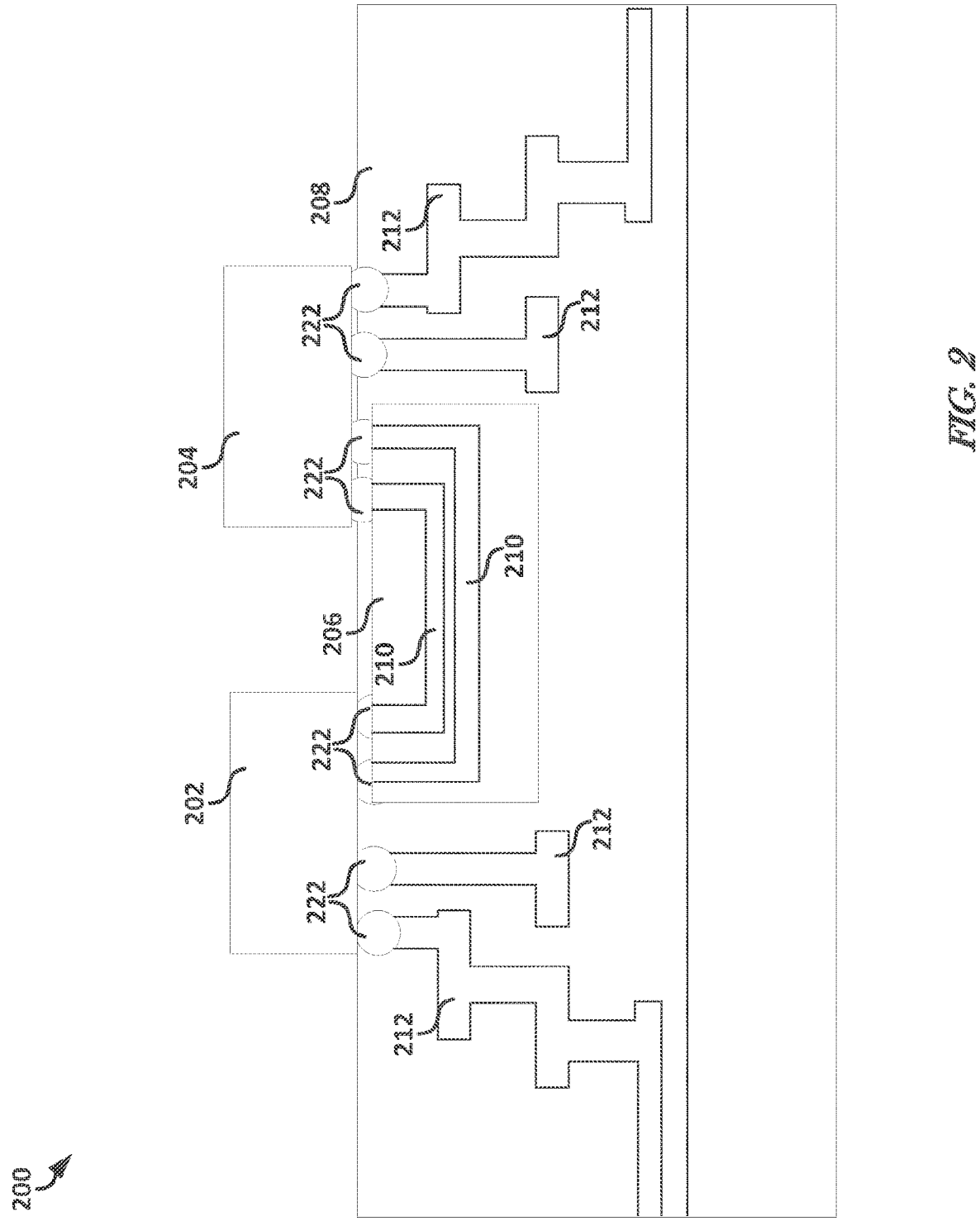
FIG. 2 illustrates, by way of example, a cross-section diagram of an embodiment of a system that allows signals to be communicated between dies through a high density interconnect structure and to the dies through a substrate.

FIG. 2 illustrates, by way of example, a cross-section view diagram of an embodiment of a system 200 that allows signals to be communicated between chips 202 an 204 through a high density interconnect structure 206 and to the chips 202 and 204 through a substrate 208. A high density interconnect structure is a chip dedicated to signal routing and created using a chip manufacturing technique. Routing density of interconnects 210 in the high density interconnect structure 206 can be up to 100 times (or more) more dense than a routing density of interconnects 212 in the substrate 208. Such an increase in density allows for a reduction in overall area that a device consumes, thus allowing for more discreet packaging.

Figure 3:
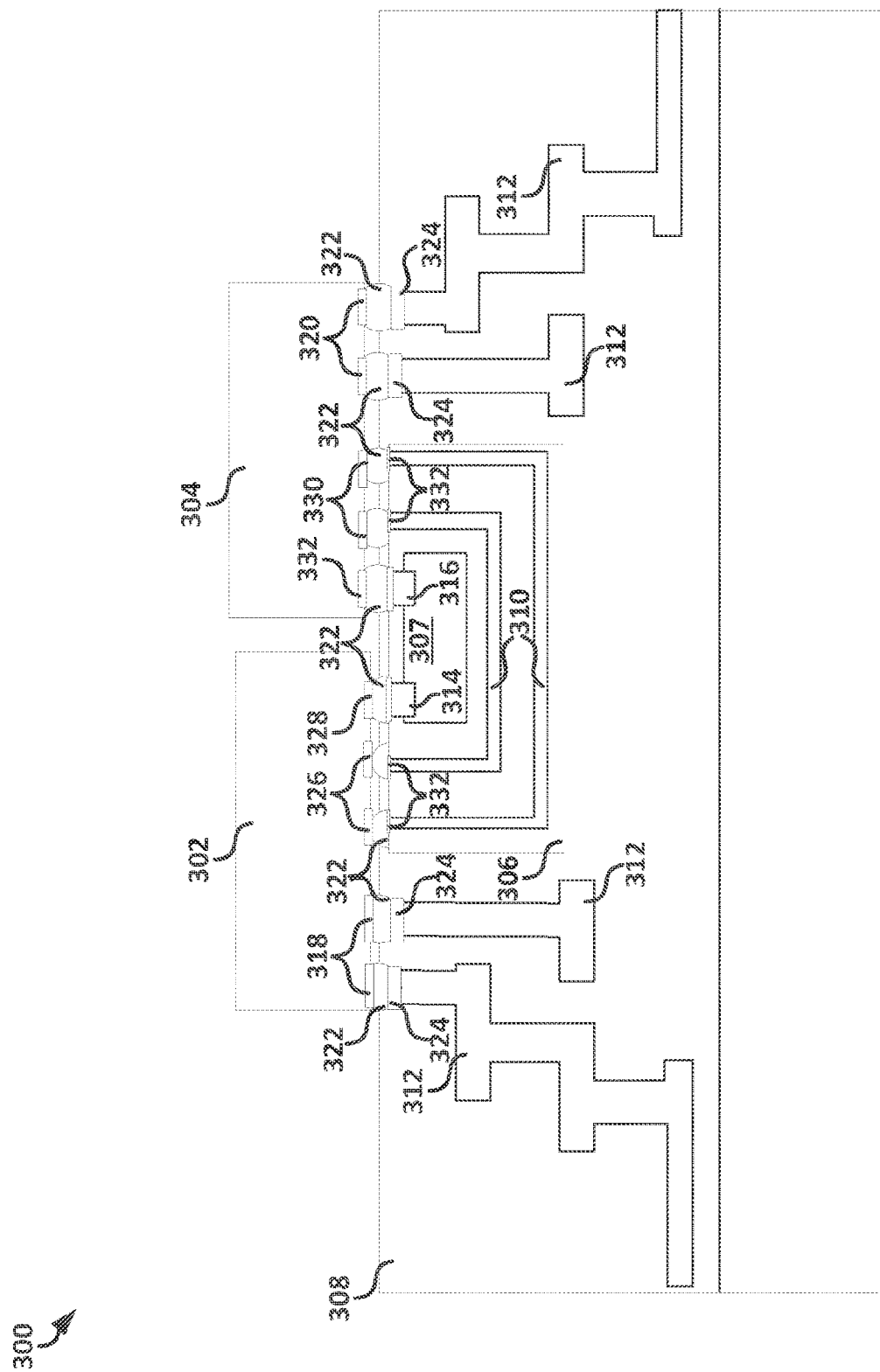
FIG. 3 illustrates, by way of example, a cross-section diagram of an embodiment of a system that allows signals to be communicated between dies.

FIG. 3 illustrates, by way of example, a cross-section diagram of an embodiment of a system 300 that allows signals to be communicated between chips 302 and 304. The system 300 as illustrated includes the chips 302 and 304, a high density interconnect structure 306 with a communication cavity 307 formed therein, and a substrate 308. The chips 302 and 304 can communicate with each other using respective antennas 314 and 316 in the communication cavity 307, using interconnects 310 of the high density interconnect structure 306, electrical adhesive 322 (e.g., solder or conductive adhesive), and/or using interconnects 312 of the substrate 308. The interconnects 312 are low density interconnects. Low density interconnects can be made using alternating layers of polymer (e.g., dielectric, such as anjinomoto buildup film (ABF)) and conductive layers. A density of the low density interconnects can be up to about nine micrometer interconnect width with about a twelve micrometer space between interconnects.

The chips 302 and 304 can include digital and/or analog components, memory, a central processing unit (CPU), and/or a radio (e.g., receive and/or transmit radio), among others. The chips 302 and 304 can be electrically coupled to each other through the interconnects 312, through one or more pads 318, 320, and 324, and an electrical adhesive 322. The interconnects 312 can be used for providing power or other signals (e.g., signals generated external to the chips 302 and 304) to the chips 302 and 304. The interconnects 312 can be used for communicating higher power signals between the chips 302 and 304.

The chips 302 and 304 can be communicatively coupled to each other through antennas 314 and 316, pads 328 and 332, and the conductive adhesive 322. The antennas 314 and 316 can produce electromagnetic waves in the communication cavity 307. The electromagnetic waves produced by one of the antennas 314 and 316 can be incident on the other antenna 316 and 314. An electromagnetic wave incident on the antenna 316 and 314 can be converted to an electrical signal (by the antenna 316 and 314) and provided to the respective chip 304 and 302. The communication cavity 307 is an open air cavity formed in the high density interconnect structure 306. Details regarding creation of the communication cavity are presented elsewhere herein.

The chips 302 and 304 can be electrically coupled to each other through the electrical interconnects 310 of the high density interconnect structure 306, pads 332, 326, and the conductive adhesive 322. The density of the interconnects 310 can be up to about one hundred times (or more) more dense than the interconnects 312. The interconnects 310 can be created using a chip-level manufacturing technique, while the interconnects 312 can be created using a substrate-level manufacturing technique.

FIGS. 4A, 4B, 4C, 4D, 4E, 4F, 4G, 4H, 4I, 4J, and 4K illustrate, by way of example, an embodiment of stages of a process of creating a communication cavity in a high density interconnect structure. The process includes beginning with a substrate 402, such as a "bare" silicon substrate, such as is illustrated in a structure 400A of FIG. 4A. The substrate 402 can be cleaned, such as by using a chemical (e.g., deionized water, tetramethylammonium hydroxide (TMAH), or other chemical that can clean silicon) bath.

Figure 4A:
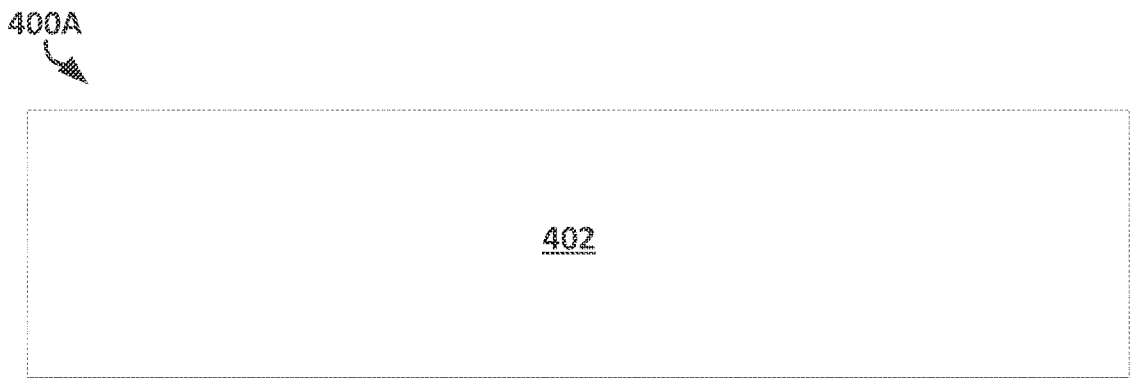
FIGS. 4A, 4B, 4C, 4D, 4E, 4F, 4G, 4H, 4I, and 4J illustrate, by way of example, an embodiment of a process of creating a cavity in a high density interconnect structure.
Figure 4B:
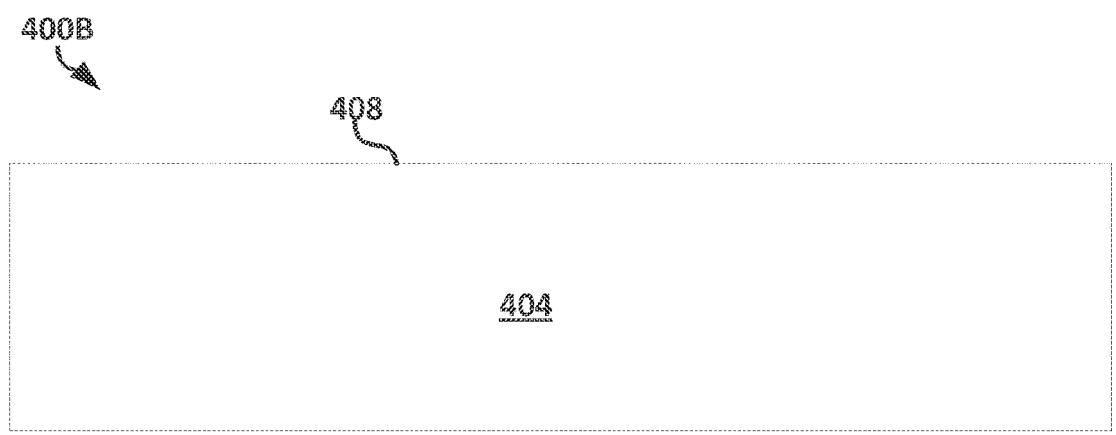

FIG. 4B illustrates a perspective view diagram of a structure 400B that includes the structure 400A after the substrate 400A is coated with a conductive material, such as copper, nickel, gold, silver, platinum, other conductive material, or a combination thereof, to create a coated substrate 404. The coated substrate 404 can include the substrate 402 after the conductive material is sputtered on the substrate 402. Other conductive materials that can be sputtered on the substrate 402 can include gold, silver, platinum, aluminum, other conductive materials, combinations thereof, or the like. The conductive material of the coated substrate 404 can act as a radio frequency shield for a communication cavity. The conductive material can be coated on all surfaces of the substrate 402 except for a top surface 408, such as to create the coated substrate 404.

Figure 4C:
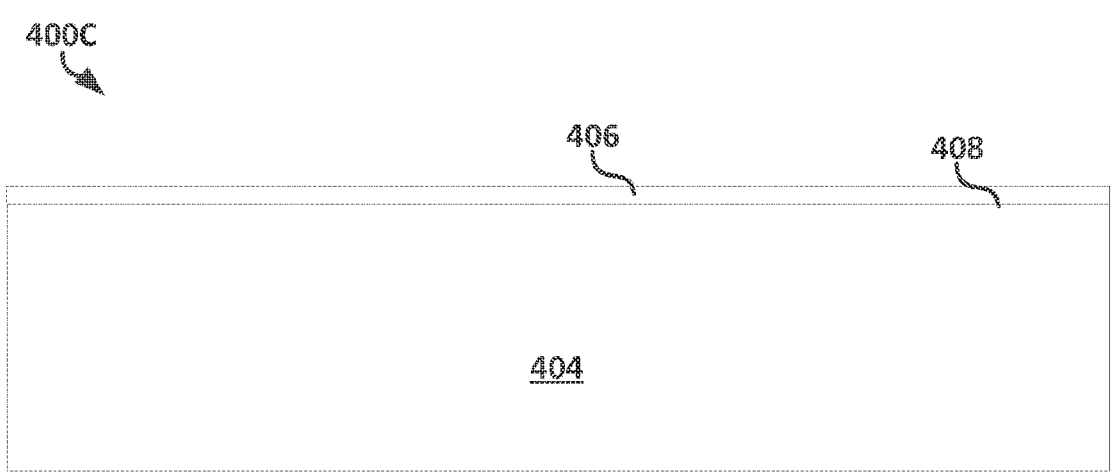

FIG. 4C illustrates a cross-section view diagram of an embodiment of a structure 400C that includes the structure 400B after a dielectric layer 406 is situated on a top surface 408 of the coated substrate 404. In one or more embodiments, the dielectric material 406 can include silicon nitride or silicon oxide. The dielectric material 406 can be situated using a chemical vapor deposition (CVD) process.

Figure 4D:
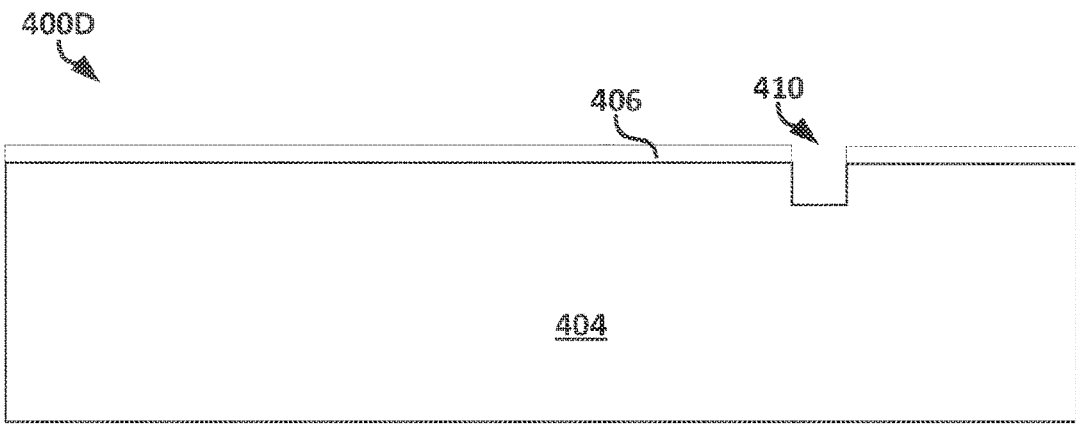

FIG. 4D illustrates a cross-section view diagram of an embodiment of a structure 400D that includes the structure 400C after a recess 410 is formed through the dielectric material 406 and into the coated substrate 404. The recess 410 can be formed by milling, etching, ablating, drilling, or the like, the dielectric material 406. The recess 410 can be formed by patterning photoresist (PR) on the coated substrate 404, exposing and developing the PR to create an opening in the conductive material of the coated substrate 404. The dielectric material 406 and substrate exposed after removing the conductive material can be removed using a reactive ion etching (RIE) process. The patterned PR can be removed.

Figure 4E:
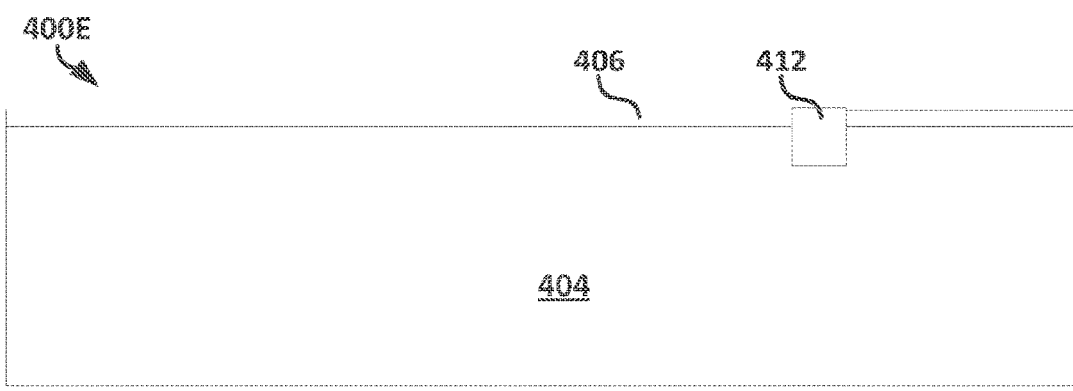

FIG. 4E illustrates a cross-section view diagram of an embodiment of a structure 400E that includes the structure 400D after the recess 410 is filled with conductive material 412. The conductive material 412 can include copper, gold, silver, platinum, tin, aluminum, another conductive material, or a combination thereof. The conductive material 412 forms a portion of an antenna in a communication cavity. The recess 410 is thus created such that, when it is filled with the conductive material 412, the conductive material 412 has dimensions that configure the antenna to transmit and/or receive electromagnetic signals at a specific frequency or range of frequencies. The conductive material 412 can fill the recess 410 using one or more of an electroless and electrolysis plating process.

Figure 4F:
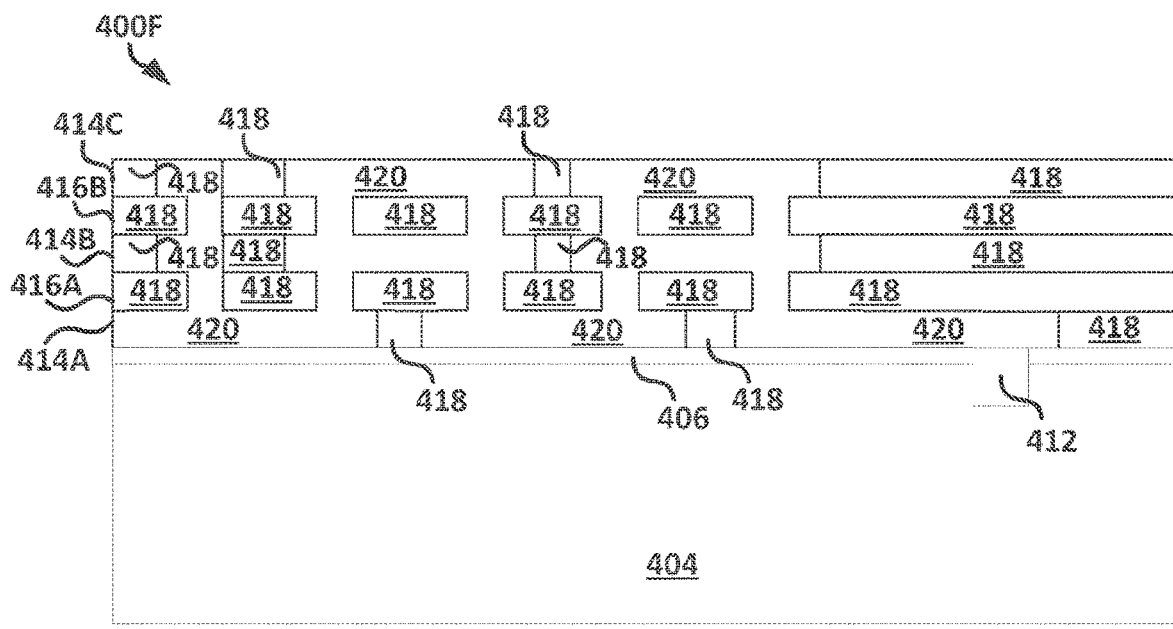

FIG. 4F illustrates a cross-section view diagram of an embodiment of a structure 400F that includes the structure 400E after a high density interconnect structure is formed on the structure 400E. The high density interconnect structure includes alternating conductive material layers 414A, 414B, and 414C and inter-layer dielectric layers 416A and 416B. The conductive material layers 414A-C are comprised primarily of conductive material and/or comprise traces or planes of the high density interconnect structure. The inter-layer dielectric layers 416A-B are comprised primarily of dielectric material, such as silicon oxide or silicon nitride layers, among others. Vias are formed in the inter-layer dielectric layers 416A-B. The amount of conductive material in the conductive material layers 414A-C is greater than an amount of conductive material in the inter-layer dielectric layers 416A-B.

The high density interconnect structure can be created using a dual damascene process, such as can include: (i) depositing an inter-layer dielectric material 418, such as by using a CVD process; (ii) patterning the inter-layer dielectric material 418, such as for interconnects (traces, pads, and/or vias); (iii) interconnects are filled with conductive material 420 using an electroless and/or electroplating process; (iv) a conductive material layer 414A-C can be patterned on a patterned dielectric layer, such as by using PR and a lithography process; (v) conductive material can be electroplated into the patterned conductive material layer, such as to form more interconnects (e.g., one or more traces, pads, planes, and/or vias); (vi) a dielectric material can be deposited on and around conductive material; (vii) the dielectric layer can then undergo chemical mechanical polishing (CMP), such as to create a flatter surface; and (viii) Step (ii) to (vi) can be repeated to create the alternating dielectric layers 416A-C and conductive material layers 414A-B. The routing density of the interconnects in the high density interconnect can include a 2 micrometer trace with a 2 micrometer space between traces.

Figure 4G:
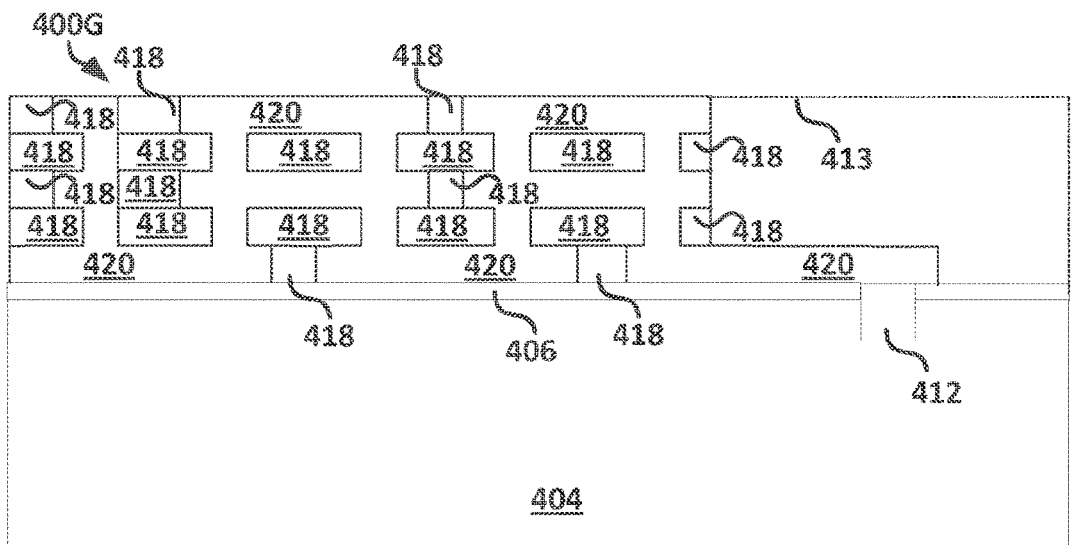

FIG. 4G illustrates a cross-section view diagram of an embodiment of a structure 400G that includes the structure 400F after a portion of dielectric material 418 is removed from the structure 400F. The portion of the dielectric material 418 can be etched using an RIE process. Removing the portion of the dielectric material 418 can include patterning PR to cover the structure 400F while leaving the portion of the dielectric material 418 to be removed exposed. The exposed portion can then be removed using the RIE process. The PR can be removed. The removed dielectric material 418 can be in a region above where a communication cavity will be formed in the coated substrate 404. The dielectric material 418 that is removed is indicated by the dashed line 413.

Figure 4H:
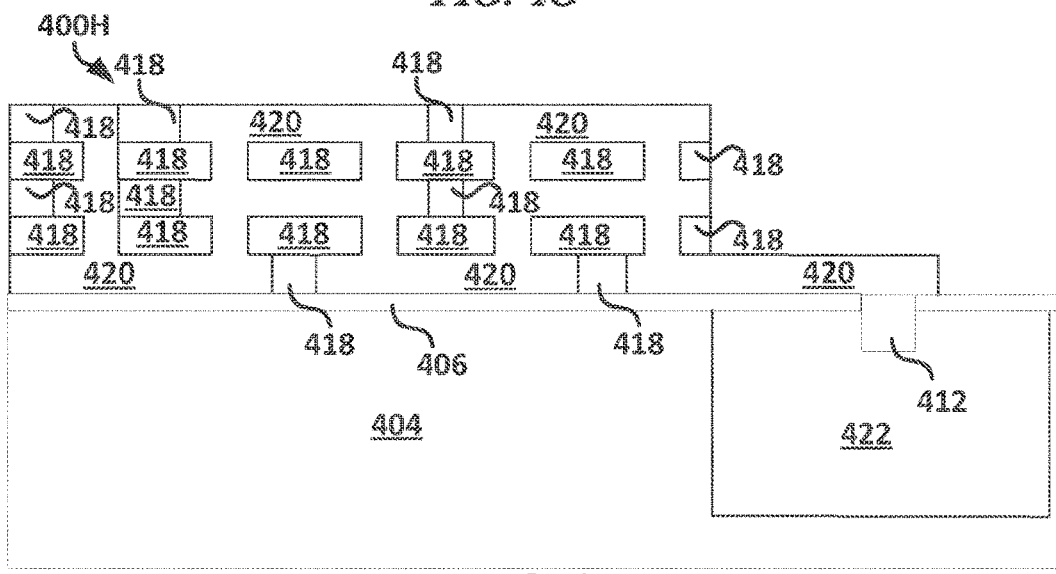

FIG. 4H illustrates a cross-section view diagram of an embodiment of a structure 400H that includes the structure 400G after a cavity 422 is formed in the coated substrate 404. The cavity 422 can be formed such that the antenna 412 is situated in the cavity 422. The antenna 412 can act as either the antenna 314 or 316. The cavity 422 can be formed by etching away a portion of the coated substrate 404. Forming the cavity 422 can include using a wet etch chemistry, such as a potassium hydroxide (KOH) solution. Forming the cavity can include patterning photoresist on the coated substrate 404, such as to cover the coated substrate while exposing the area to be removed to form the cavity 422. The exposed portions of the substrate can be removed, such as without removing the dielectric material 406. The PR can be removed. The antenna 412 hangs in open air in the cavity 422.

Figure 4I:
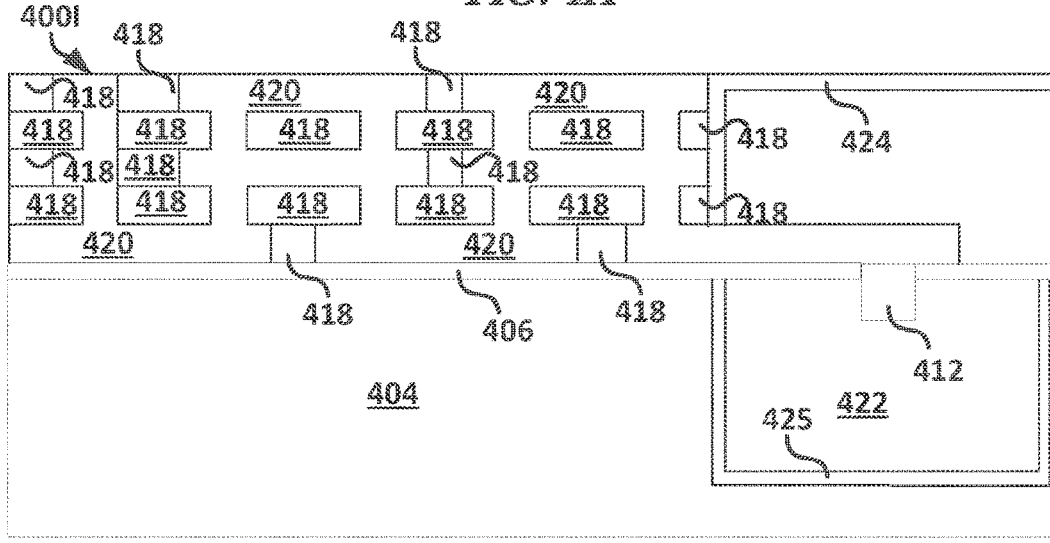

FIG. 4I illustrates a cross-section view diagram of an embodiment of a structure 400I that includes the structure 400H after a conductive material 425 is situated on walls of the cavity 422. The conductive material 425 can be situated using a sputtering technique. The conductive material 425 can be coated on exposed portions of the substrate 404, such as shown in FIG. 4I. The conductive material 425 can include copper, nickel, aluminum, gold, silver, platinum, combinations thereof, or other conductive material, such as to create a coated substrate 504

Figure 4J:
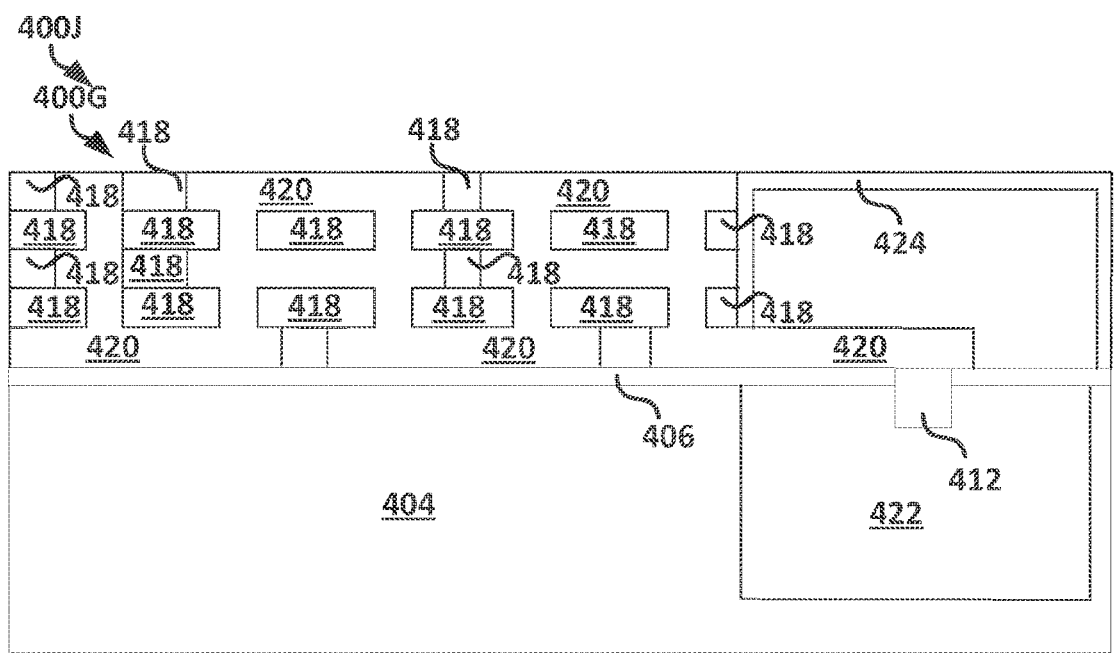

FIG. 4J illustrates a cross-section view diagram of an embodiment of a structure 400J that includes the structure 400I with a coated cover material 424 over the cavity 422. The cover material 424 can include a silicon substrate material, such as the same material as the substrate 402, or a glass material, among others. The cover material 424 can include substantially a same footprint as a footprint of the dielectric material 418 removed (indicated by the dashed line 413 of FIG. 4G). The cover material 424 can fill in the space previously occupied the by the removed dielectric material indicated by the dashed line 413. The cover material 424 can be coated with a conductive material, such as copper, nickel, aluminum, gold, silver, platinum, other conductive material, combinations thereof, or the like. The conductive material can form at least a portion of an RF shield for a future cavity in the cover material 424.

Figure 5A:
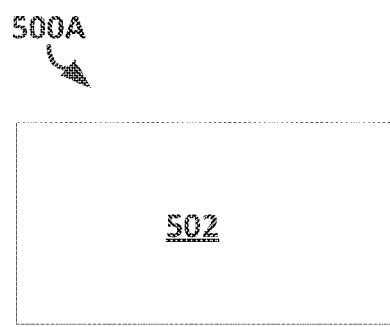
FIGS. 5A, 5B, 5C, and 5D illustrate, by way of example, respective stages of an embodiment of a process for creating a cover material.
Figure 5B:
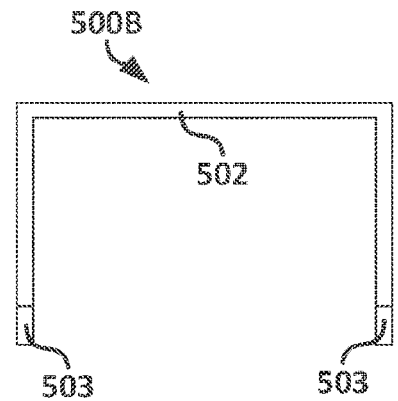
Figure 5C:
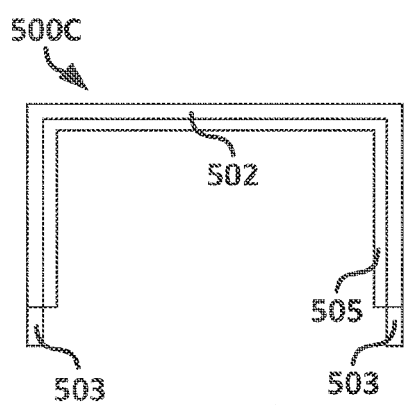
Figure 5D:
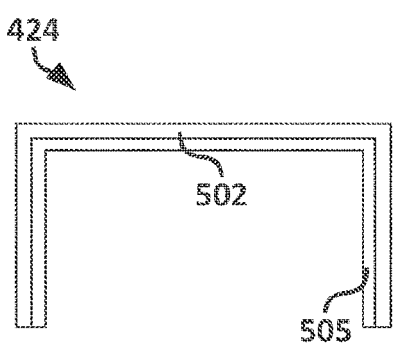

The cover material 424 can be manufactured independently of the structure 400I and then attached to the structure 400I, such as to form the structure 400J. The cover material 424 can be attached using, for example, a metal-to-metal bonding process, such as silver-to-silver bonding, or an adhesive (e.g., a conductive adhesive) bonding process as discussed elsewhere herein). FIGS. 5A, 5B, 5C, and 5D illustrate respective stages of an embodiment of a process for creating the cover material 424. FIG. 5A illustrates an embodiment of a structure 500A that includes substrate material 502. The substrate material 502 can include a glass, silicon, or other substrate material. FIG. 5B illustrates an embodiment of a structure 500B that includes the structure 500A after PR 503 is patterned on the substrate 502 and the substrate 502 is etched to remove portions thereof exposed by the PR 503. FIG. 5C illustrates an embodiment of a structure 500C that includes the structure 500B after the substrate material 502 is coated (such as by sputtering) with a conductive material 505, such as copper, nickel, aluminum, gold, silver, platinum, combinations thereof, or other conductive material, such as to create a coated substrate. The conductive material 505 can coat all exposed inner walls of the substrate 502, such as shown in FIG. 5C. FIG. 5D illustrates an embodiment of the cover material 424 after the PR 503 is removed from the structure 500C.

FIG. 5C illustrates a cross-section view of an embodiment of a structure 500C that includes the structure 500B after portions of the substrate material of the coated substrate 504 are removed. To create the structure 500C, the side 506 can be patterned with PR, such as by using lithography to define an opening to be made in the coated substrate 504. Exposed substrate material can then be removed, such as by using a wet chemistry. The PR can be removed and the structure 500C can be cleaned, such as to remove any unwanted debris or chemicals used in the etch process.

The structure 500C can be attached to the structure 400I to create the structure 400J. The communication cavity of the structure 400J can include the cavity created between the cover material 424 and the cavity 422. The communication cavity can fully enclose antennas in the cavity with air (or other dielectric) surrounding the antennas. Attaching the cover material 424 to the structure 400I can include coating the cover material 424 with an adhesive, such as an ultra violet (UV) curable adhesive, such as in locations at which the cover material 424 is to be attached to the structure 400I. The adhesive can be added to the cover material 424 by situating UV curable adhesive on a slide and touching the cover material 424 to the slide to transfer the adhesive to the cover material 424. The cover material 424 can then be aligned with the proper location on the structure 400I, such as by using pre-placed fiducials, situated on the structure 400H, and exposed to UV radiation to cure the adhesive. A slide (coated with UV curable adhesive and/or conductive material) can be situated on external openings prior to curing the adhesive on the cover material 424, such as to complete the enclosure. The structure 400J includes a communication cavity in a high density interconnect structure. The communication cavity can include an RF shield. While only one antenna 422 is shown in the cross-section view of the FIGS. 4E-4J, one or more other antennas can be included in the communication cavity using a same process, but at a different location on the coated substrate 404 and dielectric material 406. Two chips can be connected to respective antennas (such as shown in FIG. 3). The antennas can be routed through the high density interconnect structure (such as shown in FIG. 3). The structure 400J can be embedded in a substrate (such as shown in FIG. 3).

FIG. 6 illustrates, by way of example, a cross-section view diagram of an embodiment of a device 600 similar to the device 300 and the structure 400I, with the device 600 including a communication cavity 602 below the high density interconnect structure 306 rather than built into, above, or on the side of the high density interconnect structure as it is in the device 300 and/or structure 400I. The communication cavity 602 of the device 600 can be manufactured independently from the substrate and attached to the substrate 308, such as in a cavity 802 (see FIG. 8) of the substrate 308.

Figure 7A:
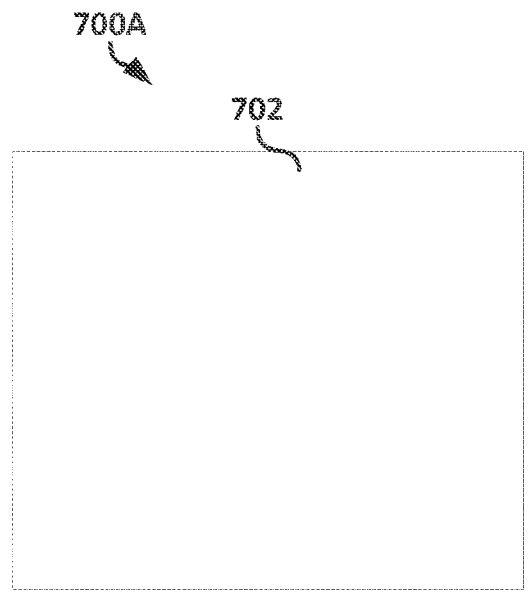
FIGS. 7A, 7B, 7C, and 7D, illustrate, by way of example, cross-section views of embodiments of stages of a process for making a communication cavity in a substrate.

FIGS. 7A, 7B, 7C, and 7D illustrate cross-section views of embodiments of stages of a process for making a communication cavity in a substrate, such as can be used in the device 600. FIG. 7A illustrates a cross-section view diagram of an embodiment of a structure 700A that includes a substrate 702 that can be made of a same material as the substrate 308. The substrate 702 can be cleaned, such as can include using deionized water.

Figure 7B:
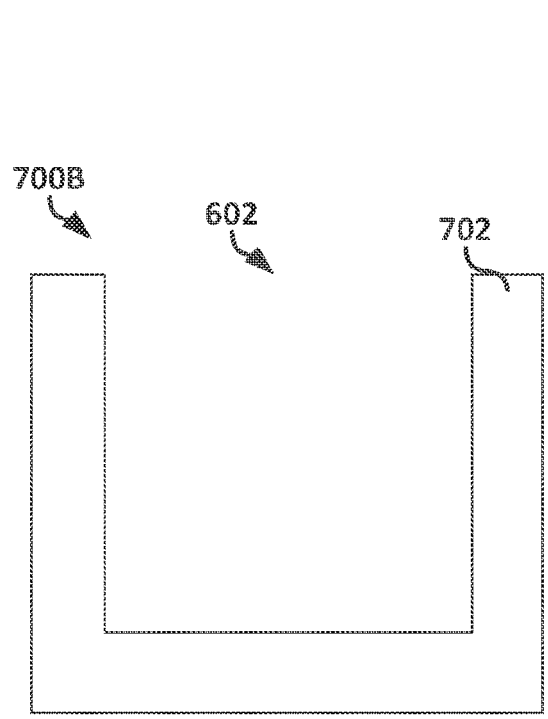

FIG. 7B illustrates a cross-section view diagram of an embodiment of a structure 700B that includes the structure 700A after a cavity 602 has been formed in the structure 700A. The cavity 602 can be formed by patterning PR on the substrate 702, such as to leave a footprint of the cavity 602 exposed on a surface of the substrate 702. Openings in the PR can be created using lithography, such as can pattern the PR. Portions of the substrate 702 can be removed, such as by using a wet etch process. The PR can then be removed after the etch.

Figure 7C:
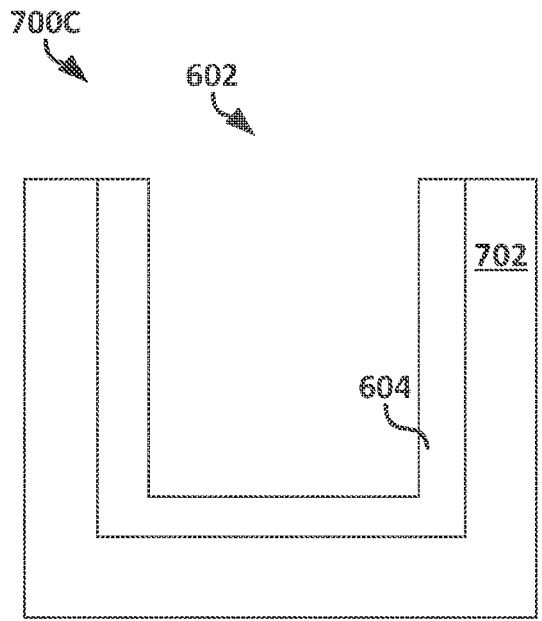

FIG. 7C illustrates a cross-section view diagram of an embodiment of a structure 700C that includes the structure 700B after a conductive material 706 is situated to coat the cavity 602. The conductive material 706 can include copper, gold, nickel, aluminum, another conductive material, or a combination thereof. The conductive material 604 can be situated using a sputter deposition process. The conductive material 604 can act as an RF shield for signals in the cavity 704.

Figure 7D:
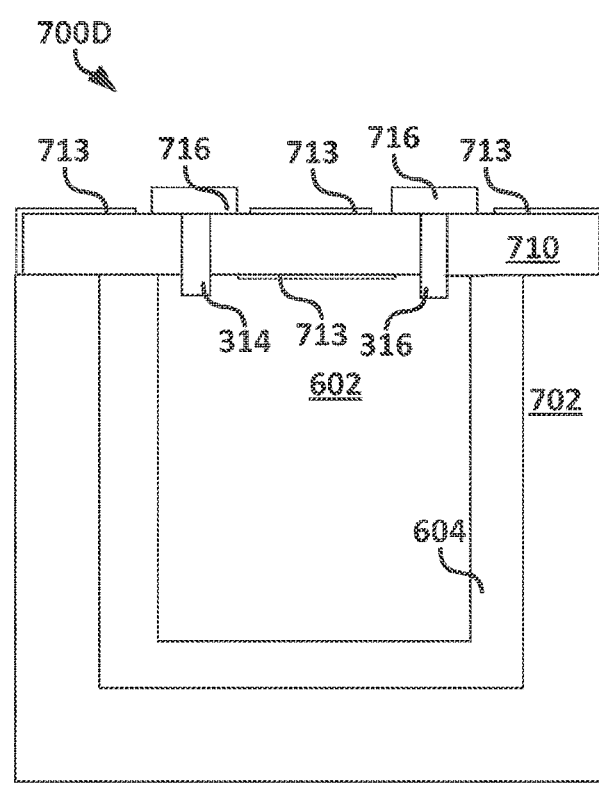

FIG. 7D illustrates a cross-section view diagram of an embodiment of a structure 700D that includes the structure 700C after a cover is attached, such as to fully enclose the cavity 602. The cover as illustrated includes a cover material 710 with antennas 314 and 316 formed therein, pads 716 formed thereon, and conductive material 713 formed thereon. FIGS. 8A, 8B, 8C, 8D, 8E, 8F, and 8G illustrate cross-section view diagrams of an embodiment of stages of a process for making the cover for the cavity 602. The cover can be manufactured separately and then attached to the structure 700C to create the structure 700D. The cover can be attached using, for example, a metal-to-metal bonding process, such as silver-to-silver bonding, or an adhesive (e.g., a conductive adhesive) bonding process as discussed elsewhere herein).

Figure 8A:
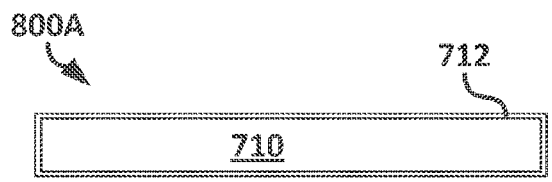
FIGS. 8A, 8B, 8C, 8D, 8E, 8F, and 8G illustrate, by way of example, cross-section views of embodiments of stages of a process for making a cover.

FIG. 8A illustrates a cover material 710 (e.g., a silicon or glass, among others) coated with conductive material 712. The conductive material 712 can include copper, nickel, gold, aluminum, other conductive material, combinations thereof, or the like. The conductive material 712 can be sputtered on the cover material 710.

Figure 8B:
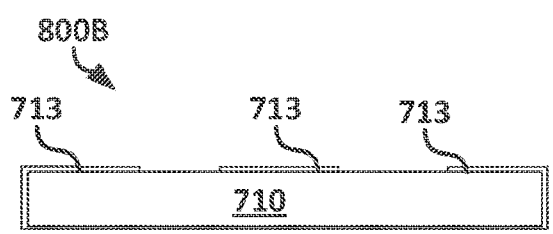

FIG. 8B illustrates a cross-section view diagram of an embodiment of a structure 800B that includes the structure 800A after the conductive material 712 is patterned to remove conductive material over locations where an antenna will be situated, such as to form patterned conductive material 713. The conductive material 712 can be removed by patterning PR on the conductive material 712, such as to expose the conductive material 712 that is to be removed. The PR can be developed and the exposed conductive material 712 can be removed, such as by using a wet etch process. The PR can then be removed.

Figure 8F:
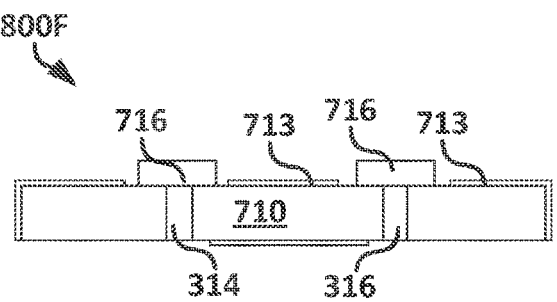
Figure 8C:
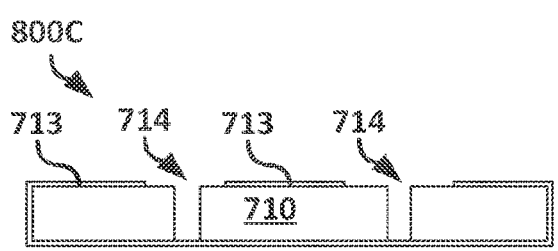

FIG. 8C illustrates a cross-section view diagram of an embodiment of a structure 800C that includes the structure 800B after holes 714 are formed in exposed portions of the cover material 710. The holes 714 define locations for the antennas 314 and 316 to be formed. In one or more embodiments, the holes 714 can be formed by patterning PR on the patterned conductive material 713 and exposed portions of the cover material 710. Openings in the patterned PR material can correspond to locations where the holes 714 will be formed. The holes 714 are then formed by removing portions of the cover material 710, such as by using a wet etch process, such as an RIE process. In one or more embodiments, the holes 714 can be formed using a mechanical drilling and/or a laser ablation process.

Figure 8D:
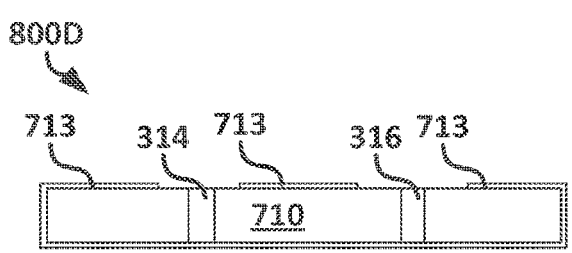

FIG. 8D illustrates a cross-section view diagram of an embodiment of a structure 800D that includes the structure 800C after the antennas 314 and 316 are formed in the cover material 710. The antennas 314 and 316 can be formed using electroless and electrolytic plating process to fill the holes 714 with conductive material.

Figure 8G:
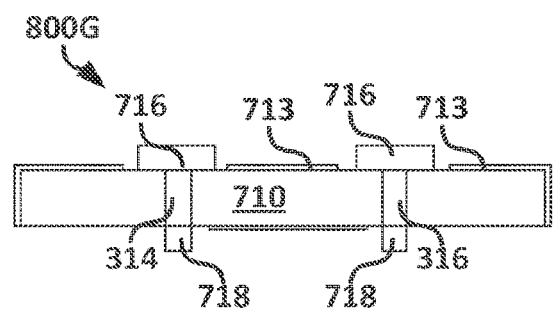
Figure 8E:
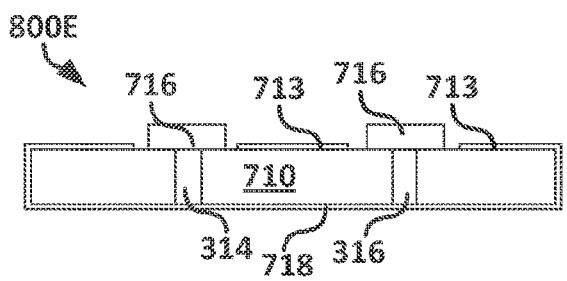

FIG. 8E illustrates a cross-section view diagram of an embodiment of a structure 800E that includes the structure 800D after conductive contacts 716 have been formed in contact with the antennas 314 and 316. The contacts 716 can be formed by patterning PR on the patterned conductive material 713 and exposed portions of the cover material 710 and exposed portions of the antennas 314 and 316. After developing the PR, the contacts 716 can be formed using electroless and electrolytic processes.

FIG. 8F illustrates a cross-section view diagram of an embodiment of a structure 800F that includes the structure 800E after a portion of the patterned conductive material 710 is removed, such to expose a portion of the antennas 314 and 316. To expose the antennas 314 and 316, a bottom side 718 of the cover material 710 can be patterned with PR, such as to define locations where the patterned conductive material 713 is to be removed. The PR is developed and a wet etch removes exposed portions of the cover material 710. The PR can then be removed.

FIG. 8G illustrates a cross-section view diagram of an embodiment of a structure 800G that includes the structure 800F after a conductive material 718 (e.g., copper, nickel, gold, aluminum, other conductive material, or combinations thereof) is formed on the antennas 316 and 314, such as to extend the antennas 314 and 316, such that when the structure 800G (sometimes referred to as the cover) is attached to the structure 700C, the antennas 314 and 316 extend into the cavity 602, such as to expose the antennas 314 and 316 to air in the cavity 602.

To attach the cover over the cavity, a UV activated adhesive can be situated on the cover material 710. The cover material 710 can be coated with the UV adhesive by first situating the adhesive on a slide and then contacting the cover material to the coated slide. Such contact transfers UV adhesive to the cover material in portions that will be attached to the substrate 602. The cover is then aligned with the structure 700C, situated on the structure 700C (such as by using fiducials), and exposed to UV radiation curing the UV adhesive and attaching the cover to the structure 700C.

Figure 9:
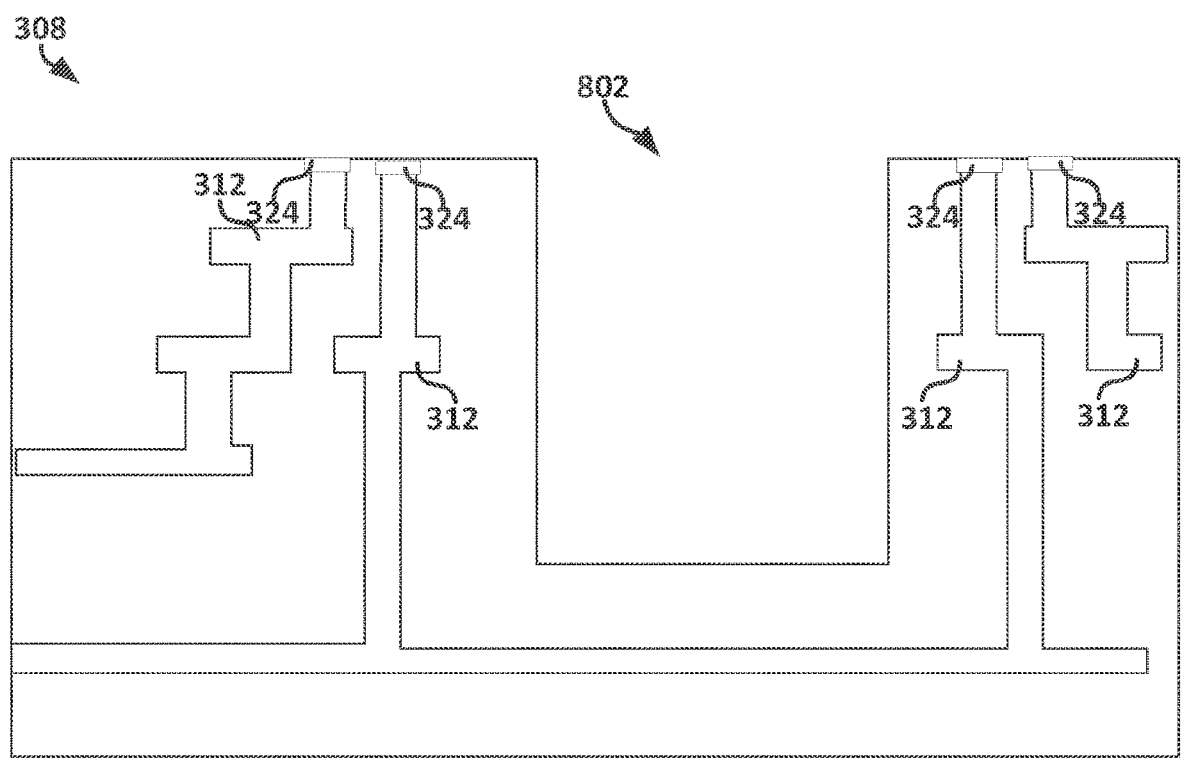
FIG. 9 illustrates, by way of example, a cross-section view diagram of a substrate that includes a recess formed therein.
Figure 10:
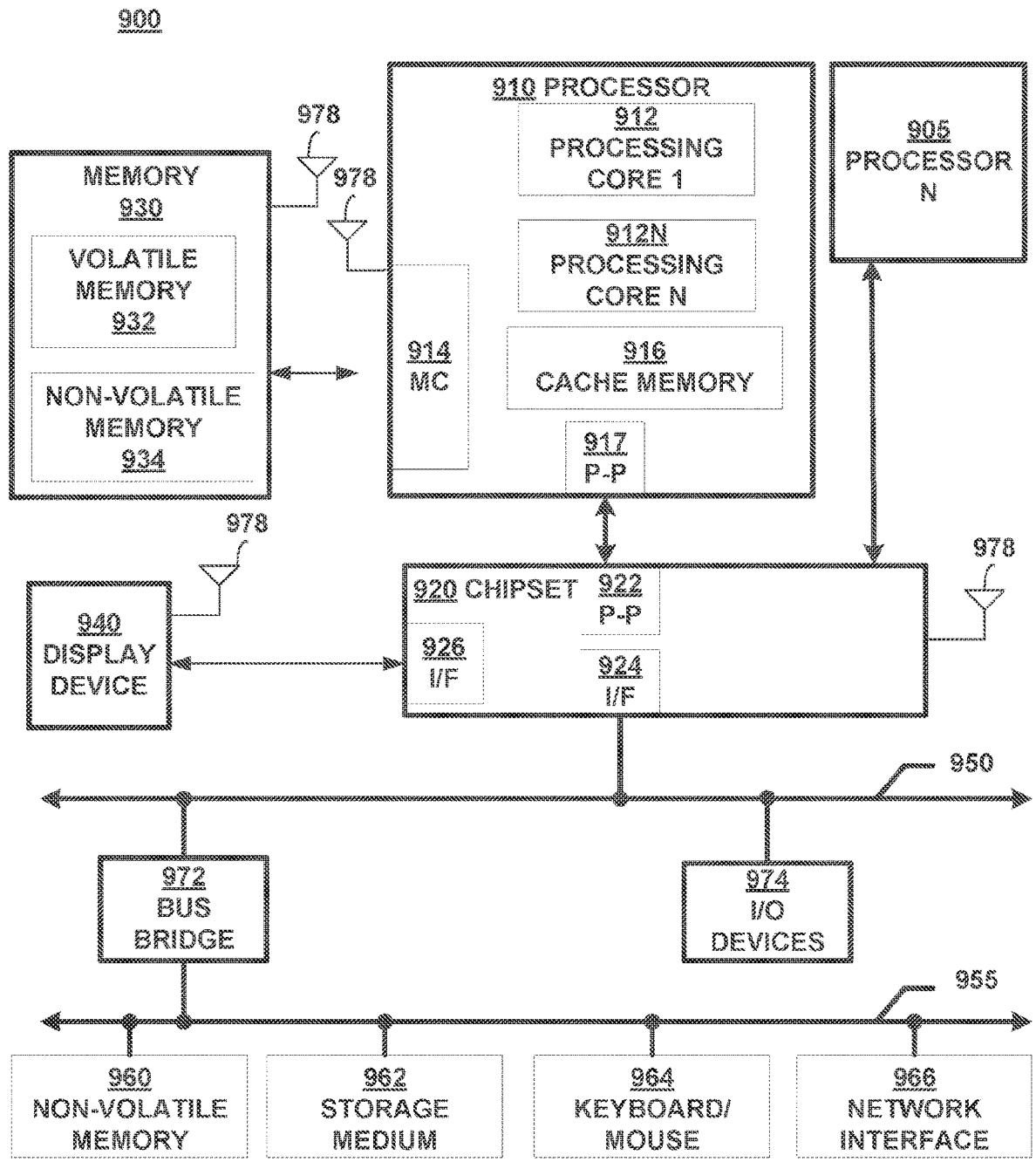
FIG. 10 illustrates, by way of example, a logical block diagram of an embodiment of system.

Note that the structure 700D can be manufactured independent of a manufacturing of the substrate 308. The substrate 308 can be manufactured to include a cavity 802, such as shown in FIG. 9. The cavity 308 can be sized to match a footprint of the structure 700D. A high density interconnect structure, in one or more embodiments, such as previously discussed, can be created on the structure 700D or manufactured independently and attached to the structure 700D. The resulting structure can then be situated in the cavity 802 and processed, such as to create a device, an example of which is shown in FIG. 6.

FIG. 9 illustrates, by way of example, a logical block diagram of an embodiment of system 900. In one or more embodiments, system 900 includes one or more components that can include an interconnect structure (e.g., a high density interconnect structure) and/or a communication cavity as discussed herein.

In one or more embodiments, processor 910 has one or more processing cores 912 and 912N, where 912N represents the Nth processor core inside processor 910 where N is a positive integer. In one or more embodiments, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one or more embodiments, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one or more embodiments, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the invention, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the invention, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920 couples with a non-volatile memory 960, a mass storage device(s) 962, a keyboard/mouse 964, and a network interface 966 via interface 924 and/or 904, etc.

In one or more embodiments, mass storage device 962 includes, but is not limited to, a solid state drive, a hard disk drive, a universal serial bus flash memory drive, or any other form of computer data storage medium. In one or more embodiments, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the components shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

EXAMPLES AND NOTES

The present subject matter may be described by way of several examples.

Example 1 can include a device comprising a substrate with first interconnect routing therein, the first interconnect routing including a first density, an interconnect structure embedded in the substrate, the interconnect structure including second interconnect routing therein and including a cavity formed therein, the second interconnect routing including a second density, the first density less than the second density, a first and a second antenna exposed in the cavity, and a first die and a second die, the first and second dies electrically connected to the first interconnect routing and electrically connected to each other through the second interconnect routing, the first die electrically connected to the first antenna and the second die electrically connected to the second antenna.

In Example 2, Example 1 can further include, wherein the first and second antennas are exposed to air in the cavity.

In Example 3, at least one of Examples 1-2 can further include, wherein the cavity is coated with a conductive material to form a radio frequency shield for the first and second antennas.

In Example 4, at least one of Examples 1-3 can further include, wherein the cavity is situated above the second interconnect routing of the interconnect structure.

In Example 5, at least one of Examples 1-3 can further include, wherein the cavity is situated alongside the second interconnect routing of the interconnect structure.

In Example 6, at least one of Examples 1-3 and 5 can further include, wherein the cavity is situated alongside and below the second interconnect routing of the interconnect structure.

In Example 7, at least one of Examples 1-6 can further include, wherein the interconnect structure further comprises a glass or silicon cover forming at least a portion of the cavity.

In Example 8, Example 7 can further include, wherein the cover is situated over the first and second antennas.

In Example 9 a method can include forming first and second antennas in a substrate, building up alternating conductive material layers and inter-layer dielectric layers over the substrate, the alternating conductive material layers and inter-layer dielectric layers including interconnect routing therein, and forming a first cavity in the substrate, around and under the first and second antennas.

In Example 10, Example 9 can further include coating the substrate with first conductive material so as to form a radio frequency signal shield for the first and second antennas.

In Example 11, at least one of Examples 9-10 can further include shaping a cover material to include a recess therein, coating the cover material with second conductive material, and attaching the cover material over the first cavity so that the recess and the first cavity align to form a larger communication cavity.

In Example 12, at least one of Examples 9-11 can further include removing dielectric material of the alternating conductive material layers and inter-layer dielectric layers over the first cavity before attaching the cover material, wherein shaping the cover material includes shaping the cover material to conform to a shape of the removed dielectric material.

In Example 13, at least one of Examples 9-12 can further include, wherein forming the first and second antennas in the substrate includes removing a portion of dielectric material on the substrate, forming respective recesses shaped and sized to match a shape and size of the first and second antennas, and filling the recesses with third conductive material.

In Example 14, at least one of Examples 9-13 can further include, wherein forming the first cavity in the substrate includes forming the first cavity outside a footprint of the alternating conductive material layers and inter-layer dielectric layers after the dielectric material of the alternating conductive material layers and inter-layer dielectric layers over the first cavity is removed.

In Example 15, at least one of Examples 9-14 can further include, wherein coating the cover material with second conductive material includes coating the cover material so as to leave a side of the cover material that is to face the first cavity after the cover material is attached over the first cavity uncoated, and wherein shaping the cover material includes etching a recess into the cover material through the uncoated side.

In Example 16, Example 15 can further include, wherein the first, second, and third conductive materials include at least one of copper, gold, and nickel.

In Example 17, at least one of Examples 9-16 can further include, wherein a density of interconnects in the interconnect routing is consistent with density of routing in a dual damascene process.

Example 18 can include a device including a substrate with a first cavity formed therein, first and second antennas exposed in and enclosed by the cavity, and an interconnect structure formed in the substrate, the interconnect structure including alternating conductive material layers and inter-layer dielectric layers.

In Example 19, Example 18 can further include, wherein a density of interconnects in the interconnect structure is consistent with a density of interconnects produced using a dual damascene process.

In Example 20, at least one of Examples 18-19 can further include, wherein the first and second antennas are exposed to air in the cavity.

In Example 21, at least one of Examples 18-20 can further include, wherein the cavity is coated with a conductive material to form a radio frequency shield for the first and second antennas.

In Example 22, at least one of Examples 18-21 can further include, wherein the cavity is situated above interconnects of the interconnect structure.

In Example 23, at least one of Examples 18-21 can further include, wherein the cavity is situated alongside interconnects of the interconnect structure.

In Example 24, at least one of Examples 18-21 and 23 can further include, wherein the cavity is situated alongside and below interconnects of the interconnect structure.

In Example 25, at least one of Examples 18-24 can further include a glass or silicon cover forming at least a portion of the cavity.

In Example 26, Example 25 can further include, wherein the cover is situated over the first and second antennas.

In Example 27, at least one of Examples 18-26 can further include, wherein the cavity is one of a plurality of cavities formed in the substrate.

In Example 28, Example 27 can further include, wherein each of the cavities is electrically isolated from each other.

In Example 29, at least one of Examples 27-28 can further include respective first and second antennas exposed in respective cavities.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
   a substrate with first interconnect routing therein;
   an interconnect structure embedded in the substrate, the interconnect structure including second interconnect routing therein and the interconnect structure including a cavity therein;
   a first antenna and a second antenna exposed in the cavity; and
   a first die and a second die, the first and second dies electrically connected to the first interconnect routing and electrically connected to each other through the second interconnect routing, the first die communicatively coupled to the second die through the first and second antennas, the first die electrically connected to the first antenna and the second die electrically connected to the second antenna.

2. The device of claim 1, wherein the first and second antennas are shielded from electromagnetic radiation external of the cavity by a conductive material coating the cavity.

3. The device of claim 1, wherein the first and second antennas are exposed to air in the cavity and the first antenna is to convey an RF signal through the air in the cavity to the second antenna.

4. The device of claim 1, wherein the cavity is above the second interconnect routing.

5. The device of claim 1, wherein the cavity is alongside the second interconnect routing.

6. The device of claim 1, wherein the cavity is below the second interconnect routing.

7. The device of claim 1, wherein the interconnect structure further comprises a glass or silicon cover forming at least a portion of the cavity.

8. The device of claim 7, wherein the cover is over the first and second antennas.

9. A device comprising:
   a substrate with first interconnect routing therein;
   an interconnect structure embedded in the substrate, the interconnect structure including second interconnect routing therein and the interconnect structure including a cavity therein;
   a first antenna and a second antenna exposed to an interior space of the cavity;
   a cover forming at least a portion of the cavity; and
   a first die and a second die, the first and second dies electrically connected to the first interconnect routing and electrically connected to each other through the second interconnect routing, the first die communicatively coupled to the second die through the first and second antennas, the first die electrically connected to the first antenna and the second die electrically connected to the second antenna.

10. The device of claim 9, wherein the cover comprises glass or silicon.

11. The device of claim 9, wherein the first and second antennas are exposed to air in the cavity.

12. The device of claim 9, wherein the first and second antennas are shielded from electromagnetic radiation external of the cavity by a conductive material coating the cavity.

13. The device of claim 9, wherein the cover is over the first and second antennas.

14. A device comprising:
a substrate with first interconnect routing therein;
an interconnect structure embedded in the substrate, the interconnect structure including second interconnect routing therein and the interconnect structure including a cavity therein, the cavity above interconnects of the second interconnect routing;
a first antenna and a second antenna exposed in the cavity; and
a first die and a second die, the first and second dies electrically connected to the first interconnect routing and electrically connected to each other through the second interconnect routing, the first die communicatively coupled to the second die through the first and second antennas, the first die electrically connected to the first antenna and the second die electrically connected to the second antenna.

15. The device of claim 14, wherein the first and second antennas are exposed to air in the cavity and the first antenna is to convey an RF signal through the air in the cavity to the second antenna.

16. The device of claim 14, wherein the first and second antennas are shielded from electromagnetic radiation external of the cavity by a conductive material coating the cavity.

17. The device of claim 14, further comprising a cover forming at least a portion of the cavity.

18. The device of claim 17, wherein the cover comprises glass or silicon.

19. The device of claim 17, wherein the cover is over the first and second antennas.

* * * * *